United States Patent
Hu et al.

(10) Patent No.: US 10,005,273 B2
(45) Date of Patent: Jun. 26, 2018

(54) PRINTING BASE AND INKJET PRINTING METHOD

(71) Applicant: Boe Technology Group Co., Ltd., Beijing (CN)

(72) Inventors: Chunjing Hu, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 14/913,287

(22) PCT Filed: Jul. 20, 2015

(86) PCT No.: PCT/CN2015/084465
§ 371 (c)(1),
(2) Date: Feb. 19, 2016

(87) PCT Pub. No.: WO2016/150044
PCT Pub. Date: Sep. 29, 2016

(65) Prior Publication Data
US 2017/0036461 A1    Feb. 9, 2017

(30) Foreign Application Priority Data
Mar. 25, 2015   (CN) .......................... 2015 1 0131712

(51) Int. Cl.
B41J 2/01       (2006.01)
B41J 11/00      (2006.01)
(Continued)

(52) U.S. Cl.
CPC ............. *B41J 2/01* (2013.01); *B41J 11/0015* (2013.01); *H01L 51/00* (2013.01);
(Continued)

(58) Field of Classification Search
CPC ...... B41J 11/0015; B41J 11/0085; B41J 2/01; H01L 51/00; H01L 51/0028; H01L 51/56; H01L 51/0005; B41M 5/0011
See application file for complete search history.

(56) References Cited

U.S. PATENT DOCUMENTS

2002/0148566 A1    10/2002  Kitano et al.
2013/0206058 A1*    8/2013  Mauck ................ H01L 21/6719
                                                           118/300
2016/0361931 A1*   12/2016  Zhao ......................... B41J 2/01

FOREIGN PATENT DOCUMENTS

CN    1618609    5/2005
CN    1781614    6/2006
(Continued)

OTHER PUBLICATIONS

Office action from Chinese Application No. 201510131712.1 dated May 18, 2016.
(Continued)

Primary Examiner — Geoffrey Mruk
(74) Attorney, Agent, or Firm — Calfee, Halter & Griswold LLP

(57) ABSTRACT

A printing base comprises: a carrying base, an extension base, a vacuum pump and a gas injection valve; the extension base is located at the periphery of the carrying base; the surface of the carrying base has at least one absorbing hole for absorbing the substrate, and the surface of the extension base has at least one injecting hole. By adding a extension base at the periphery of the carrying base, the invention can avoid the provision of test area at the periphery of the display area on the substrate, and increase the area of the display area, and in turn reduce the bezel width of the liquid crystal display panel.

17 Claims, 2 Drawing Sheets

(51) Int. Cl.
  *H01L 51/00*    (2006.01)
  *H01L 51/56*    (2006.01)
  *B41M 5/00*     (2006.01)
(52) U.S. Cl.
  CPC ...... *H01L 51/0005* (2013.01); *H01L 51/0028* (2013.01); *H01L 51/56* (2013.01); *B41M 5/0011* (2013.01)

(56) References Cited

FOREIGN PATENT DOCUMENTS

| | | | | |
|---|---|---|---|---|
| CN | 1794099 | | 6/2006 | |
| CN | 101671927 | | 3/2010 | |
| CN | 102315393 | | 1/2012 | |
| CN | 103862862 | | 6/2014 | |
| CN | 104369541 | * | 2/2015 | ................ B41J 2/01 |
| CN | 204278756 | | 4/2015 | |
| JP | 2000124106 | | 4/2000 | |
| JP | 2007003559 | | 1/2007 | |

OTHER PUBLICATIONS

International Search Report and Written Opinion from PCT/CN15/84465 dated Dec. 18, 2015.
Office action from Chinese Application No. 201510131712.1 dated Dec. 24, 2015.
Office Action from China Application No. 201510131712.1 dated Oct. 25, 2016.

* cited by examiner

PRINTING BASE AND INKJET PRINTING METHOD

RELATED APPLICATIONS

The present application is the U.S. national phase entry of PCT/CN2015/084465, with an international filing date of Jul. 20, 2015, which claims priority to Chinese Application No. 201510131712.1, filed Mar. 25, 2015, the entire disclosures of which are incorporated by reference herein.

TECHNICAL FIELD

The invention refers to a field of light emitting device manufacturing, and more specifically to a printing base and inkjet printing method.

BACKGROUND

In the manufacturing process for PLED (Polymer Light-Emitting Diode), usually the light emitting pixels of three primary colors red, green, and blue are formed by inkjet printing technology. That is, absorb a substrate which has been ITO (Indium Tin Oxide) patterned in advance on a printing base, and spray a hole-transport material and a solution of light emitting materials of three colors red, green and blue in sub-pixel recesses on the substrate, to form light emitting pixels of three primary colors red, green and blue. However, the drying atmospheres of the edge pixels and center pixels of the substrate are inconsistent from each other, which results in the drying rate of the edge pixels being larger than the drying rate of the center pixels, leads to non-uniform thickness of the whole pixel thin film of the substrate, so that largely affects the display effect of the PLED.

The solution in the prior art usually is providing a test area at periphery of a display area of the substrate, which display area is an area for forming the pixels; after that, when the inkjet printing is performed, the test area is firstly inkjet printed, to form a solution atmosphere around the display area, and then the display area is inkjet printed. By means of the solvent atmosphere formed, the drying rate of the edge pixels and the drying rate of the center pixels of the display area can be maintained consistent, which in turn ensures that the uniform thickness of the pixel thin film in the display area. However, when the size of the substrate is fixed, providing a test area at the periphery of the display area of the substrate reduces the area of the display area. Besides, the test area cannot be used for displaying image, which therefore increases the bezel width of the liquid crystal display panel.

SUMMARY

For solving the problems in the prior art, an embodiment of the invention provides a printing base and an inkjet printing method. The technical solutions of the embodiments of the invention are as follows.

In an aspect, an embodiment of the invention provides a printing base, which comprises: a carrying base, an extension base, a vacuum pump and a gas injection valve;

The extension base is located at the periphery of the carrying base; the surface of the carrying base has at least one absorbing hole for absorbing the substrate, and the surface of the extension base has at least one injecting hole;

The vacuum pump is connected with the absorbing holes, and the gas injection valve is connected with the at least one injecting hole, and is used for injecting a gas comprising at least a solvent gas for inkjet printing from the at least one injecting hole to the periphery of the carrying base, to form a solvent atmosphere at the periphery of the substrate on the carrying base and make the drying atmospheres of edge pixels and center pixels in the substrate consistent.

According to a preferred embodiment, the at least one injecting hole inclines towards the center of the carrying base by a preset angle, relative to the surface of the carrying base.

According to a preferred embodiment, the preset angle is smaller than or equal to 60 degrees.

According to a preferred embodiment, the at least one injecting hole is multiple, a portion of which incline towards the center of the carrying base by a preset angle relative to the surface of the carrying base, and another portion of which are vertical relative to the surface of the carrying base.

According to a preferred embodiment, the at least one injecting hole is disposed on the carrying base in an array with multiple rows and multiple columns, therein at least one round of injecting holes at the periphery incline towards the center of the carrying base by a preset angle relative to the surface of the carrying base, and the other injecting holes are vertical relative to the surface of the carrying base.

According to a preferred embodiment, the gas injected by the gas injection valve comprises a gas mixture mixed by both an inertia gas and a solvent gas for inkjet printing.

According to a preferred embodiment, the gas injection valve comprises a first gas injection valve and a second gas injection valve, and the gas injected by the first gas injection valve is an inertia gas, and the gas injected by the second gas injection valve is a solvent gas for inkjet printing.

According to a preferred embodiment, the width of the extension base ranges from 5 to 10 centimeters.

In another aspect, the invention provides an inkjet printing method employing the above printing base, which method comprises:

By at least one absorbing hole connected to a vacuum pump, absorb a substrate on a carrying base at which the at least one absorbing hole is located;

Inject a solution for inkjet printing to a display area of the substrate absorbed on the carrying base, to form pixels of the display area;

By at least one injecting hole connected to the gas injection valve, inject a gas comprising at least a solvent gas for inkjet printing to the periphery of the carrying base, to form a solvent atmosphere at the periphery of the substrate absorbed on the carrying base, and make the drying atmospheres of the edge pixels and center pixels of on the substrate being consistent.

According to a preferred embodiment, the gas injected to the periphery of the carrying base comprises a gas mixture mixed by an inertia gas and a solvent gas for inkjet printing.

In the embodiments of the invention, by adding a extension base at the periphery of the carrying base, and injecting a gas to the periphery of the carrying base by the at least one injecting hole in the extension base, a solvent atmosphere is formed at the periphery of the substrate on the carrying base, making the drying atmospheres of the edge pixels and center pixels of on the substrate being consistent, thus ensuring the drying rates of the edge pixels and the center pixels of the display area are consistent, indirectly increasing the area of the display area, and in turn reducing the bezel width of the liquid crystal display panel.

BRIEF DESCRIPTION OF DRAWINGS

In order to describe the technical solution in embodiments of the invention more clearly, the figures required for description of the embodiments will be introduced in brief below. Obviously, the figures in the following only illustrate some embodiments of the invention, and for those skilled in the art, other embodiments can be obtained from these figures without expending creative effort, and the other embodiments are within the spirit and scope of the invention as well. In the figures, the same reference signs refer to the same components.

DETAILED DESCRIPTION OF EMBODIMENTS

In order to make the objective, technical solution and advantages of the invention more clear, the embodiments of the invention will be described in more detail in conjunction with the figures. It should be recognized that, the embodiments illustrated below are only used for explaining the invention, and do not constitute limitation to the scope of the invention. It should also be recognized that, the figures are not drawn by scale. On the contrary, some components may be exaggerated to highlight the creations of the invention.

Figure 1:
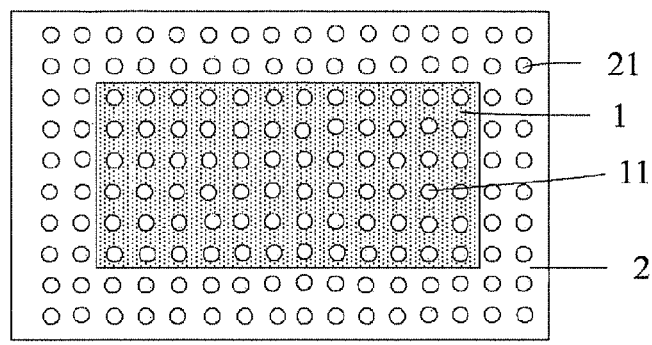
FIG. 1 is a top view of a printing base provided by an embodiment of the invention.

An embodiment of the invention provides a printing base. See FIGS. 1 and 2, the printing base comprises a carrying base 1, an extension base 2, a vacuum pump 3 and a gas injection valve 4.

The extension base 2 is located at the periphery of the carrying base 1. The carrying base 1 has at least one absorbing hole 11 for absorbing the substrate 5, and the extension base 2 has at least one injecting hole 21.

The vacuum pump 3 is connected to the at least one absorbing hole 11, and the gas injection valve 4 is connected with the at least one injecting hole 21, and is used for injecting gas from the at least one injecting hole 21 to the periphery of the carrying base 1, to form a solvent atmosphere at the periphery of the substrate 5 on the carrying base 1 and make the drying atmospheres of the edge pixels and the center pixels in the substrate 5 consistent.

In the embodiments of the invention, by adding a extension base at the periphery of the carrying base, and injecting a gas to the periphery of the carrying base by the at least one injecting hole in the extension base, a solvent atmosphere is formed at the periphery of the substrate on the carrying base, making the drying atmospheres of the edge pixels and center pixels of on the substrate being consistent, thus ensuring the drying rates of the edge pixels and the center pixels of the display area are consistent, which may in turn avoid the provision of test area at the periphery of the display area on the substrate, and indirectly increases the area of the display area, and in turn reduces the bezel width of the liquid crystal display panel. In a preferred embodiment, the surfaces of the carrying base and the extension base are at the same horizontal plane.

It should be noted that, the vacuum pump 3 and the at least one absorbing hole 11 may be connected through pipes, and the gas injection valve 4 and the at least one injecting hole 21 may also be connected through pipes. Besides, in an embodiment of the invention, the dimension of the carrying base 1 is larger than or equal to the dimension of the substrate 5. preferably, in order to further ensure the thickness of the whole pixel thin film of the substrate uniform, the dimension of the carrying base 1 can be set as equal to the size of the substrate 5, so than the gas injected by the at least one injecting hole 21 may act on the periphery of the substrate better.

Further, the at least one absorbing hole 11 on the carrying substrate 1 may be holes arranged in an array with multiple rows and columns, or of course, also may be holes arranged irregularly, which is unlimited specifically in the embodiments of the invention. Similarly, the at least one injecting hole 21 on the extension base 2 may be holes arranged in an array with multiple rows and columns, or may be holes arranged irregularly, which is unlimited specifically in the embodiments of the invention. Besides, the diameter of the at least one absorbing hole 21 may equal to that of the at least one injecting hole 21. Certainly, they may be not equal. This is unlimited specifically here by the embodiments of the invention.

Figure 2:
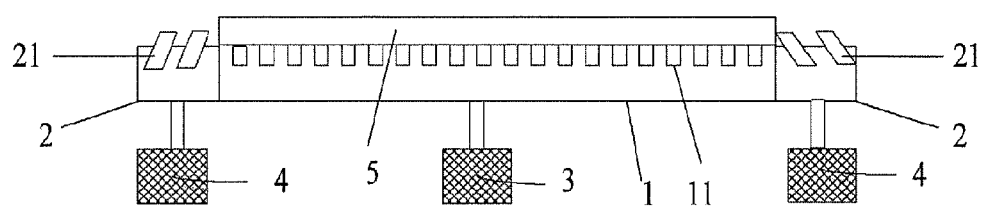
FIG. 2 is a side view of a printing base provided by an embodiment of the invention.

Optionally, see FIG. 2, the at least one injecting hole 21 inclines towards the center of the carrying base 1 by a preset angle, relative to the surface of the carrying base 1. That is, the at least one injecting hole 21 inclines relative to the carrying base, and the angle between the at least one injecting hole 21 and the surface of the carrying base is a preset angle. In a preferred embodiment, the preset angle of the injecting holes relative to the surface of the carrying base is adjustable, to realize better effect with regard to the substrates with different dimensions.

In an embodiment of the invention, the at least one injecting hole 21 may incline relative to the carrying base, or may be vertical relative to the carrying base. When the at least one injecting hole 21 inclines relative to the carrying base, the gas injected by the at least one injecting hole 21 may better act on the periphery of the carrying base, so as to save some injection gas.

Figure 4:
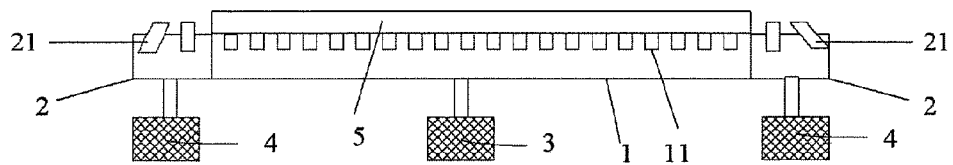
FIG. 4 is a side view of another printing base provided by an embodiment of the invention.

Further, it can be disposed that, a portion of the at least one injecting hole 21 incline relative to the carrying base, and another portion thereof is vertical relative to the carrying base. For example, when the at least one injecting hole 21 are arranged on the extension base in an array with multiple rows and columns, since the extension base 2 is at the periphery of the carrying base 1, it can be disposed that, in the at least one injecting hole 21 on the extension base 2, at least one round of the injecting holes 21 at the periphery incline relative to the carrying base, and the other injecting holes 21 are vertical relative to the carrying base, as shown by FIG. 4 schematically. In the course of actual application, there are many ways of the at least one injecting hole 21 inclining or being vertical relative to the carrying base, which are not all listed here.

Optionally, the preset angle is smaller than or equal to 60 degrees.

Further, at least one of the preset angles may larger than or equal to 45 degree, which is unlimited here by the embodiments of the invention.

Optionally, in the embodiments of the invention, the number of the gas injection valves may be at least one, and the gas injected by the gas injection valve 4 comprises a gas mixture mixed by an inertia gas and a solvent gas for inkjet printing.

For preventing the pixels on the substrate which has been inkjet printed from being polluted, the gas transported by the gas injection valve 4 may be a solvent gas for inkjet printing. Since diffusion area of the solvent gas for inkjet printing is random and not controllable, the solvent gas is mixed with an inertia gas. The inertia gas would not be liquefied, is controllable and would not pollute the pixels on the substrate. Therefore, the solvent gas may be driven by the inertia gas, so that the diffusion direction and diffusion amount of the solvent gas can be better controlled, and the drying atmosphere of the entire display area are the same and uniform.

Figure 3:
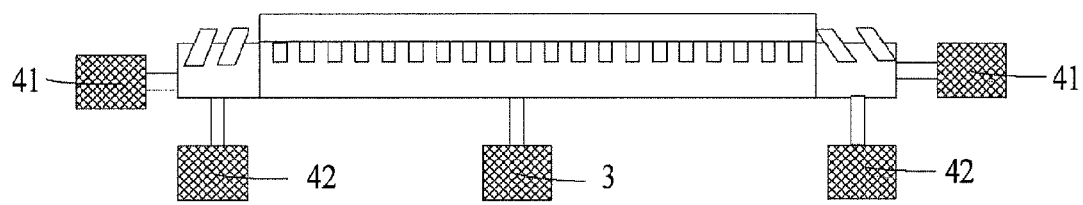
FIG. 3 is a side view of another printing base provided by an embodiment of the invention.

Optionally, see FIG. 3, the injecting valve 4 may comprise a first gas injection valve 41 and a second gas injection valve 42, and the gas injected by the first gas injection valve 41 is an inertia gas, and the gas injected by the second gas injection valve 42 is a solvent gas for inkjet printing.

Therein, when the inertia gas and the solvent gas for inkjet printing are injected separately by the first gas injection valve 41 and the second gas injection valve 42 respectively, the first gas injection valve 41 and the second gas injection valve 42 may connect to the at least one injecting valves 21 simultaneously.

While it is not shown in the figures, it can be understood by those skilled in the art, the injection valves further connect to the reservoirs for reserving the solvent gas and/or the inertia gas. In an embodiment of the invention, the inertia gas and the solvent gas for inkjet printing may be mixing reserved and injected by one and same gas injection valve, or may be reserved separately and injected by different gas injection valves respectively. This is unlimited here by the embodiment of the invention.

Optionally, the width of the extension base 2 ranges from 5 to 10 centimeters.

It should be noted that, for the carrying bases having different dimensions, the width of the extension base may be different. For example, when the dimension of the carrying base is relatively large, the width of the extension base can be set as relative large; and when the dimension of the carrying base is relatively small, the width of the extension base can be set as relative small. This is unlimited specifically by the embodiment of the invention.

In a preferred embodiment, the absorbing holes and injecting holes can be exchanged as needed, that is can be connected to the vacuum pump or gas injection valve switchably respectively. This can realize the adaptability of the printing base for the substrates with different dimensions.

The above optional technical solutions can all be combined arbitrarily to form optional embodiments of the invention, which would not be described here in the description.

Figure 5:
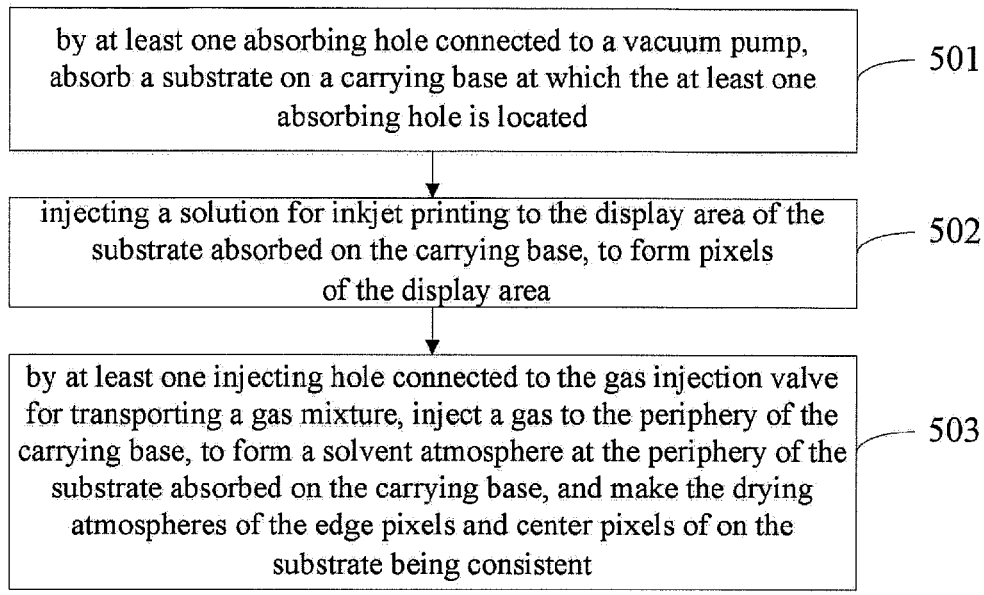
FIG. 5 is a flowchart of an inkjet printing method provided by an embodiment of the invention.

An embodiment of the invention provides an inkjet printing method employing the printing base in the above embodiments, see FIG. 5, which method comprises:

Step 501: by at least one absorbing hole connected to a vacuum pump, absorb a substrate on a carrying base at which the at least one absorbing hole is located;

Step 502: injecting a solution for inkjet printing to the display area of the substrate absorbed on the carrying base, to form pixels of the display area;

Step 503: by at least one injecting hole connected to the gas injection valve for transporting a gas mixture, inject a gas to the periphery of the carrying base, to form a solvent atmosphere at the periphery of the substrate absorbed on the carrying base, and make the drying atmospheres of the edge pixels and center pixels of on the substrate being consistent. Therein, the gas mixture comprises an inertia gas and a solvent gas for inkjet printing.

In the embodiments of the invention, by injecting a gas to the periphery of the side of the carrying base which absorbs the substrate, by the at least one injecting hole in the extension base, make the drying atmospheres of the edge pixels and center pixels of on the substrate being consistent, thus ensuring the drying rates of the edge pixels and the center pixels of the display area are consistent. As such, an test area at the periphery of the display area in the substrate may be eliminated, thus increasing the area of the display area, and in turn reducing the bezel width of the liquid crystal display panel.

Figure 6:
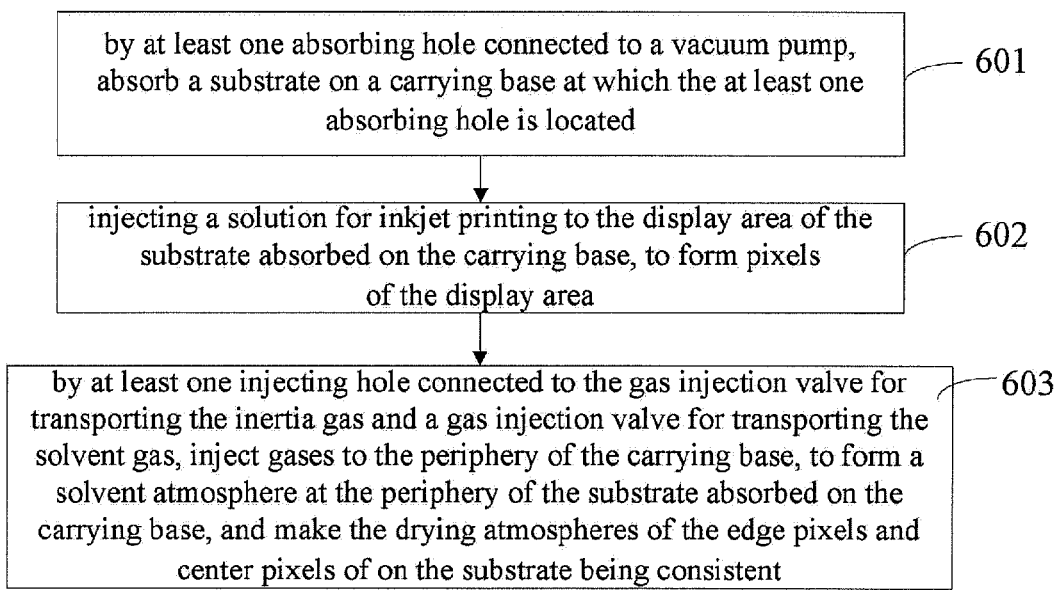
FIG. 6 is a flowchart of another inkjet printing method provided by an embodiment of the invention.

An embodiment of the invention provides an inkjet printing method employing the printing base in the above embodiments, see FIG. 6, which method comprises:

Step 601: by at least one absorbing hole connected to a vacuum pump, absorb a substrate on a carrying base at which the at least one absorbing hole is located;

Specifically, the substrate is placed on the carrying base, and the vacuum pump is started, and the air between the carrying base and the substrate is extracted by the at least one absorbing hole connected to the vacuum pump, to absorb the substrate on the carrying base.

Therein, the air between the carrying base and the substrate is extracted by a vacuum pump, make the space between the carrying base and the substrate within a vacuum state, to absorb the substrate on the carrying base, and in turn fix the substrate on the printing base. Therefore, the substrate can be inkjet printed accurately, that is, spray a hole-transport material and a solution of light emitting materials of three colors of red, green and blue in corresponding sub-pixel recesses on the substrate accurately.

It should be noted that, in the embodiments of the invention, the substrate may be a base substrate which has been ITO patterned. In the actual application, the substrate can be other substrates, which is unlimited here.

Step 602: injecting a solution for inkjet printing to the display area of the substrate absorbed on the carrying base, to form pixels of the display area.

Therein, when spraying the solution for inkjet printing to the display area of the substrate absorbed on the carrying base, the solution for inkjet printing can be heated, to make the solute in the solution being liquefied, so that spray the solution on the substrate by a sprayer with multiple injection pores. Specifically, the inkjet printing method can refer to the existing inkjet printing method, which would not be described in detail here.

It should be noted that, in the embodiments of the invention, the solution for inkjet printing may be a solution of hole-transport material and light emitting material of three colors red, green, and blue. Of course, in the actual applications, the solution may be solutions of other materials, which is unlimited specifically here.

After spraying the solution for inkjet printing to the display area of the substrate absorbed on the carrying base, the sub-pixel recesses of the substrate are deposited with liquid drops of the solution. After that, the pixels on the substrate are dried by the volatilization of the solvent, to form a pixel thin film.

Step 603: by at least one injecting hole connected to the gas injection valve for transporting the inertia gas and a gas injection valve for transporting the solvent gas, inject gases to the periphery of the carrying base, to form a solvent atmosphere at the periphery of the substrate absorbed on the carrying base, and make the drying atmospheres of the edge pixels and center pixels of on the substrate being consistent.

During drying the pixels on the substrate, the solvent volatilizes from the edge area of the liquid drop, and the variation of the volume of the liquid drop mainly occurs at the center area of liquid drop. Therefore, a solution flow will be formed from center to edge inside the liquid drop. This flow would drive the solute in the solution migrating to the edge of the liquid drop and depositing at the edge, to form a deposition profile of thick edge and thin center; and since the drying atmosphere of the edge pixels and the drying atmosphere of the center pixels of the substrate are different, this results in the drying atmosphere of the edge pixels is larger than the drying atmosphere of the center pixels, leading to the thickness of the pixel thin film of the entire substrate is non-uniform. Therefore, in the embodiment of the invention, a gas comprising an inertia gas and a solvent gas is sprayed to the periphery of the carrying substrate by at least one injecting hole connected to the gas injection valve, so as to form a solvent atmosphere at the periphery of the substrate absorbed on the carrying base, and ensure the drying atmospheres of the edge pixels and the center pixels of the substrate consistent, and in turn ensure the drying rates of the edge pixels and the center pixels of the substrate consistent.

Optionally, the gas sprayed to the periphery of the carrying base may be a solvent gas for inkjet printing. Preferably, the gas sprayed to the periphery of the carrying base may be a gas mixture mixed by an inertia gas and a solvent gas for inkjet printing.

In order to prevent the pixels on the substrate which is already be inkjet printed from being polluted, the gas sprayed to the periphery of the carrying base may be a solvent gas for inkjet printing. Since the diffusion area of the solvent gas of the inkjet printing is random and not controllable, the solvent gas is mixed with an inertia gas. The inertia gas would not be liquefied, is controllable and would not pollute the pixels on the substrate. Therefore, the solvent gas may be driven by the inertia gas, so that the diffusion direction and diffusion amount of the solvent gas can be better controlled, and the drying atmosphere of the entire display area are the same and uniform.

It should be noted that, the solvent gas for inkjet printing may be obtained by heating the solvent.

It should be noticed that, the order of the steps in the method described is not absolutely in accordance with the order illustrated in the figures. On the contrary, the steps in the method may be performed in a order opposite to the order illustrated in the figures, or performed concurrently.

In the embodiment of the invention, by injecting a gas to the periphery of the side of the carrying base which absorb the substrate, by the at least one injecting hole in the extension base, make the drying atmospheres of the edge pixels and center pixels of on the substrate being consistent, thus ensuring the drying rates of the edge pixels and the center pixels of the display area are consistent. As such, the provision of test area at the periphery of the display area on the substrate can be eliminated, so that increases the area of the display area, and in turn reduces the bezel width of the liquid crystal display panel. Besides, the gas injected to the periphery of the carrying base is an inertia gas and a solvent gas for inkjet printing, which can prevent the pixels on the substrate from being polluted, and the solvent gas may be driven by the inertia gas, so that the diffusion direction and diffusion amount of the solvent gas can be better controlled, and the drying atmosphere of the entire display area are the same and uniform.

The above described are only preferred embodiments of the invention, and are not intended to limit the invention. Any amendments, equivalent substitutes, improvements etc. made within the spirit and principle of the invention should be included in the protection scope of the invention. It should be noted that, the wording "comprise" does not exclude the presence of other elements or steps which are not listed in the claims. The wording "a" or "an" ahead of an element does not exclude the presence of a plurality of such elements. The mere fact that certain measures are recited in mutually different dependent claims does not indicate that a combination of these measures cannot be used to advantage. Any reference signs in the claims should not be construed to limit scopes.

The invention claimed is:

1. A printing base comprising: a carrying base, an extension base, a vacuum pump and a gas injection valve;
   the extension base is located at the periphery of the carrying base; a surface of the carrying base has at least one absorbing hole for absorbing a substrate, and a surface of the extension base has multiple injecting holes;
   the vacuum pump is connected with the absorbing holes, and the gas injection valve is connected with the multiple injecting holes, and is used for injecting a gas comprising at least a solvent gas for inkjet printing from the multiple injecting holes to the periphery of the carrying base, to form a solvent atmosphere at the periphery of the substrate on the carrying base and make the drying atmospheres of edge pixels and center pixels in the substrate consistent,
   wherein the multiple injecting holes are disposed on the carrying base in an array to form a plurality of rings of injecting holes, wherein at least one ring of injecting holes at the periphery incline towards the center of the carrying base by a preset angle relative to the surface of the carrying base, and the other injecting holes are vertical relative to the surface of the carrying base.

2. The printing base according to claim 1, wherein at least one injecting hole inclines towards the center of the carrying base by a preset angle, relative to the surface of the carrying base.

3. The printing base according to claim 2, wherein the preset angle is smaller than or equal to 60 degrees.

4. The printing base according to claim 3, wherein the width of the extension base ranges from 5 to 10 centimeters.

5. An inkjet printing method employing the printing base according to claim 3, therein, the method comprises:
   by at least one absorbing hole connected to a vacuum pump, absorb a substrate on a carrying base at which the at least one absorbing hole is located;
   Inject a solution for inkjet printing to a display area of the substrate absorbed on the carrying base, to form pixels of the display area;
   by at least one injecting hole connected to the gas injection valve, inject a gas comprising at least a solvent gas for inkjet printing to the periphery of the carrying base, to form a solvent atmosphere at the periphery of the substrate absorbed on the carrying base, and make the drying atmospheres of the edge pixels and center pixels of on the substrate being consistent.

6. The printing base according to claim 2, wherein the width of the extension base ranges from 5 to 10 centimeters.

7. An inkjet printing method employing the printing base according to claim 2, therein, the method comprises:
   by at least one absorbing hole connected to a vacuum pump, absorb a substrate on a carrying base at which the at least one absorbing hole is located;
   Inject a solution for inkjet printing to a display area of the substrate absorbed on the carrying base, to form pixels of the display area;
   by at least one injecting hole connected to the gas injection valve, inject a gas comprising at least a solvent gas for inkjet printing to the periphery of the carrying base, to form a solvent atmosphere at the periphery of the substrate absorbed on the carrying base, and make the drying atmospheres of the edge pixels and center pixels of on the substrate being consistent.

8. The printing base according to claim 1, wherein the gas injection valve comprises a first gas injection valve and a second gas injection valve, and the gas injected by the first gas injection valve is an inertia gas, and the gas injected by the second gas injection valve is a solvent gas for inkjet printing.

9. An inkjet printing method employing the printing base according to claim 8, therein, the method comprises:
- by at least one absorbing hole connected to a vacuum pump, absorb a substrate on a carrying base at which the at least one absorbing hole is located;
- inject a solution for inkjet printing to a display area of the substrate absorbed on the carrying base, to form pixels of the display area;
- by at least one injecting hole connected to the first and second gas injection valves, inject an inertia gas and a solvent gas for inkjet printing to the periphery of the carrying base, to form a solvent atmosphere at the periphery of the substrate absorbed on the carrying base, and make the drying atmospheres of the edge pixels and center pixels of on the substrate being consistent.

10. The printing base according to claim 1, wherein the width of the extension base ranges from 5 to 10 centimeters.

11. The printing base according to claim 1 wherein the width of the extension base ranges from 5 to 10 centimeters.

12. The printing base according to claim 1 wherein the width of the extension base ranges from 5 to 10 centimeters.

13. The printing base according to claim 1, wherein the width of the extension base ranges from 5 to 10 centimeters.

14. An inkjet printing method employing the printing base according to claim 1, wherein the method comprises:
- by at least one absorbing hole connected to a vacuum pump, absorb a substrate on a carrying base at which the at least one absorbing hole is located;
- Inject a solution for inkjet printing to a display area of the substrate absorbed on the carrying base, to form pixels of the display area;
- by at least one injecting hole connected to the gas injection valve, inject a gas comprising at least a solvent gas for inkjet printing to the periphery of the carrying base, to form a solvent atmosphere at the periphery of the substrate absorbed on the carrying base, and make the drying atmospheres of the edge pixels and center pixels of on the substrate being consistent.

15. The method according to claim 14, therein, the gas injected to the periphery of the carrying base comprises a gas mixture mixed by both an inertia gas and a solvent gas for inkjet printing.

16. An inkjet printing method employing the printing base according to claim 1, therein, the method comprises:
- by at least one absorbing hole connected to a vacuum pump, absorb a substrate on a carrying base at which the at least one absorbing hole is located;
- Inject a solution for inkjet printing to a display area of the substrate absorbed on the carrying base, to form pixels of the display area;
- by at least one injecting hole connected to the gas injection valve, inject a gas comprising at least a solvent gas for inkjet printing to the periphery of the carrying base, to form a solvent atmosphere at the periphery of the substrate absorbed on the carrying base, and make the drying atmospheres of the edge pixels and center pixels of on the substrate being consistent.

17. An inkjet printing method employing the printing base according to claim 1, therein, the method comprises:
- by at least one absorbing hole connected to a vacuum pump, absorb a substrate on a carrying base at which the at least one absorbing hole is located;
- Inject a solution for inkjet printing to a display area of the substrate absorbed on the carrying base, to form pixels of the display area;
- by at least one injecting hole connected to the gas injection valve, inject a gas comprising at least a solvent gas for inkjet printing to the periphery of the carrying base, to form a solvent atmosphere at the periphery of the substrate absorbed on the carrying base, and make the drying atmospheres of the edge pixels and center pixels of on the substrate being consistent.

* * * * *